(12) United States Patent
Kim et al.

(10) Patent No.: US 10,331,000 B2
(45) Date of Patent: Jun. 25, 2019

(54) LIQUID CRYSTAL DISPLAY AND METHOD OF MANUFACTURING THEREOF

(71) Applicant: Samsung Display Co., Ltd., Yongin-si (KR)

(72) Inventors: Duk-Sung Kim, Asan-si (KR); Jae-Jong Lim, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 226 days.

(21) Appl. No.: 15/340,943

(22) Filed: Nov. 1, 2016

(65) Prior Publication Data

US 2017/0168331 A1 Jun. 15, 2017

(30) Foreign Application Priority Data

Dec. 11, 2015 (KR) .................. 10-2015-0177426

(51) Int. Cl.
| | |
|---|---|
| *G02F 1/1368* | (2006.01) |
| *G02F 1/1343* | (2006.01) |
| *G02F 1/1362* | (2006.01) |
| *H01L 21/44* | (2006.01) |
| *H01L 29/45* | (2006.01) |
| *H01L 29/786* | (2006.01) |
| *G02F 1/1345* | (2006.01) |
| *H01L 29/417* | (2006.01) |
| *H01L 27/12* | (2006.01) |

(52) U.S. Cl.
CPC .......... *G02F 1/1368* (2013.01); *G02F 1/1345* (2013.01); *G02F 1/13439* (2013.01); *G02F 1/134309* (2013.01); *G02F 1/136286* (2013.01); *H01L 21/44* (2013.01); *H01L 27/124* (2013.01); *H01L 27/127* (2013.01); *H01L 27/1225* (2013.01); *H01L 29/41733* (2013.01); *H01L 29/45* (2013.01); *H01L 29/7869* (2013.01); *H01L 29/78696* (2013.01); *G02F 2001/13629* (2013.01); *G02F 2001/136231* (2013.01); *G02F 2001/136295* (2013.01); *G02F 2201/12* (2013.01); *G02F 2201/123* (2013.01); *G02F 2202/10* (2013.01); *G02F 2203/01* (2013.01)

(58) Field of Classification Search
CPC ............... G02F 1/1368; G02F 1/13439; G02F 1/134363
USPC .................................................... 349/43, 141
See application file for complete search history.

(56) References Cited

U.S. PATENT DOCUMENTS

| 9,018,623 B2 | 4/2015 | Kim et al. | |
|---|---|---|---|
| 2007/0171340 A1* | 7/2007 | Lee .................. | G02F 1/133555 349/114 |

FOREIGN PATENT DOCUMENTS

| KR | 10-2013-0026842 | 3/2013 |
|---|---|---|
| KR | 10-2014-0014759 | 2/2014 |

* cited by examiner

*Primary Examiner* — Thanh Nhan P Nguyen
(74) *Attorney, Agent, or Firm* — H.C. Park & Associates, PLC

(57) ABSTRACT

A liquid crystal display including a semiconductor layer disposed on a substrate, a transparent electrode disposed n the semiconductor layer, the transparent electrode overlapping the semiconductor layer and including a source electrode, a drain electrode facing the source electrode, and a first electrode extending from the drain electrode, and an insulating layer disposed on the transparent electrode. The semiconductor layer contacts an entire surface of the source electrode, the drain electrode, and the first electrode.

20 Claims, 30 Drawing Sheets

140  129  110

140  128  110

LIQUID CRYSTAL DISPLAY AND METHOD OF MANUFACTURING THEREOF

CROSS-REFERENCE TO RELATED APPLICATION

This application claims priority from and the benefit of Korean Patent Application No. 10-2015-0177426, filed in the Korean Intellectual Property Office on Dec. 11, 2015, which is hereby incorporated by reference for all purposes as if fully set forth herein.

BACKGROUND

Field

Exemplary embodiments relate to a liquid crystal display and a method of manufacturing thereof.

Discussion of the Background

A liquid crystal display is a widely used type of flat panel display, and includes pixels. Each pixel may include a pixel electrode and a liquid crystal layer disposed between the pixel electrode and a common electrode. The liquid crystal display displays an image by controlling voltages of the pixel electrode and the common electrode to provide an electric field to liquid crystal molecules of the liquid crystal layer. The liquid crystal molecules of the liquid crystal display may be rearranged according to the electric field, thereby controlling an amount of transmitted light.

The pixel electrode is connected to a switching element, such as a thin film transistor, to receive a data voltage. The thin film transistor includes a source electrode, a drain electrode, and a semiconductor layer functioning as a channel of the thin film transistor. One of the source electrode and the drain electrode may be connected to the pixel electrode, and the thin film transistor may transfer the data voltage to the pixel electrode through them.

After forming the semiconductor layer of the thin film transistor, a metal component may be formed thereon. The metal component can flow in the semiconductor layer, and it may contaminate the semiconductor layer functioning as the channel. In this case, performance of the thin film transistor may deteriorate.

The above information disclosed in this Background section only for enhancement of understanding of the background of the inventive concept, and, therefore it may contain information that does not form the prior art that is already known in this country to a person of ordinary skill in the art.

SUMMARY

Exemplary embodiments provide a liquid crystal display having improved reliability.

Exemplary embodiments provide a method of manufacturing a liquid crystal display having improved reliability.

Additional aspects will be set forth in the detailed description which follows, and, in part, will be apparent from the disclosure, or may be learned by practice of the inventive concept.

An exemplary embodiment discloses a liquid crystal display including: a semiconductor layer disposed on a substrate; a transparent electrode disposed on the semiconductor layer, the transparent electrode overlapping the semiconductor layer and including a source electrode, a drain electrode facing the source electrode, and a first electrode extending from the drain electrode; and an insulating layer disposed on the transparent electrode. The semiconductor layer contacts an entire surface of source electrode, the drain electrode, and the first electrode.

An exemplary embodiment also discloses a method of manufacturing a liquid crystal display including: forming a semiconductor layer and a transparent electrode on a substrate, the transparent electrode being disposed on the semiconductor layer and including a source electrode, a drain electrode facing the source electrode, and a first electrode extending from the drain electrode; forming an insulating layer on the semiconductor layer, the source electrode, the drain electrode, and the first electrode; and forming a signal line on the insulating layer. The semiconductor layer and the transparent electrode are formed based on a same exposure mask.

An exemplary embodiment also discloses a liquid crystal display including: a semiconductor layer disposed on a substrate; a source electrode, a drain electrode facing the source electrode, and a pixel electrode extending from the drain electrode, each of the source electrode, the drain electrode, and the pixel electrode being disposed on the semiconductor layer; an insulating layer disposed on the semiconductor layer, the source electrode, the drain electrode, and the pixel electrode; and a signal line disposed on the insulating layer, the signal line being connected to the source electrode through a contact hole of the insulating layer. The insulating layer covers the semiconductor layer between the source electrode and the drain electrode from the signal line.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
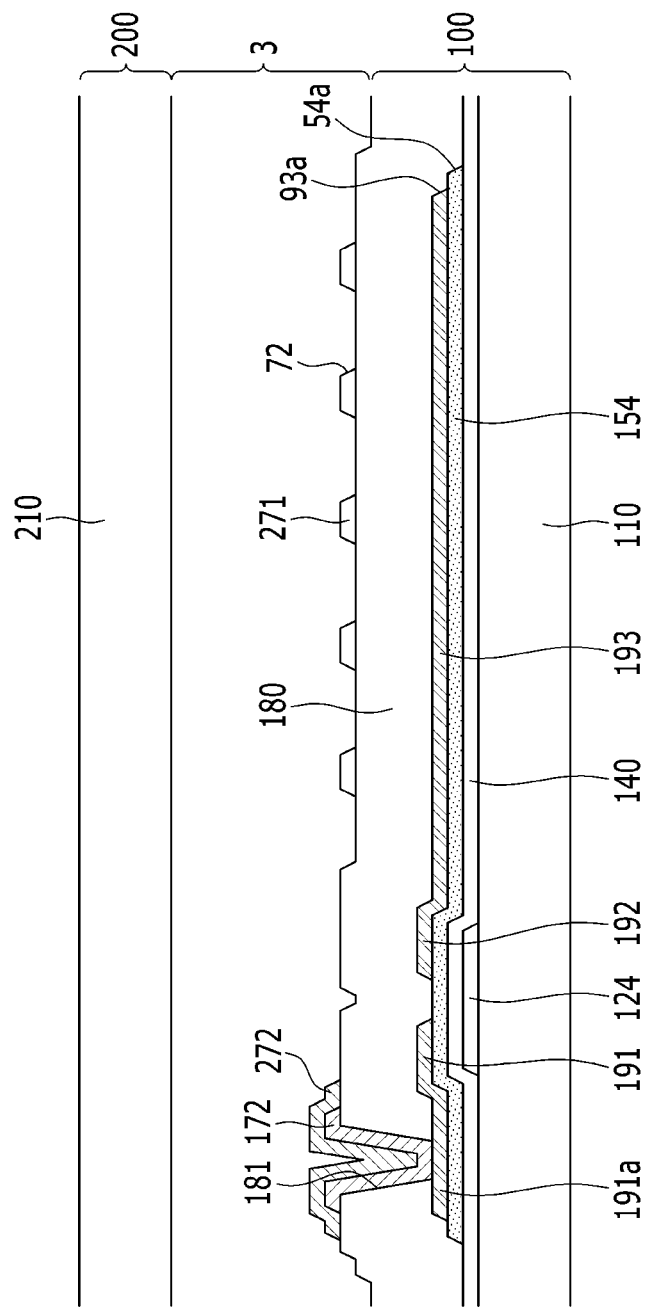
FIG. 1 is a cross-sectional view of a liquid crystal display according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a cross-sectional view of a liquid crystal display according to an exemplary embodiment.

Referring to FIG. 1, a liquid crystal display includes a first display panel 100, a second display panel 200, and a liquid crystal layer 3 interposed between the first display panel 100 and the second display panel 200.

The first display panel 100 includes a first substrate 110, a gate electrode 124, a gate insulating layer 140, a semiconductor layer 154, and transparent electrodes 191, 192, and 193.

The first substrate 110 may extend in a planar direction. The gate electrode 124 is disposed on the first substrate 110. The gate insulating layer 140 is disposed on the gate electrode 124 and the first substrate 110. The semiconductor layer 154 is disposed on the gate insulating layer 140. Source electrode 191, drain electrode 192, and pixel electrode 193, which are transparent electrodes, are disposed on the semiconductor layer 154. The source electrode 191 may have a first extension 191a extending from the source electrode 191. The drain electrode 192 may face the source electrode 191, and the pixel electrode 193 may extend from the drain electrode 192 to a pixel area, which is visible to a user.

The source electrode 191, the drain electrode 192, and the pixel electrode 193 are placed at the same layer, and formed of the same material. The source electrode 191, the drain electrode 192, and the pixel electrode 193 may be formed of a transparent conductive material.

According to an exemplary embodiment, the entire surface of the transparent electrodes 191, 192, and 193 may contact the semiconductor layer 154. A first edge 54a of the semiconductor layer 154 protrudes in the planar direction more than a second edge 93a of the transparent electrodes 191, 192, and 193. This will be described in more detail with reference to FIGS. 2 and 3.

The first display panel 100 may further include a passivation layer 180, a signal line, and a common electrode 271.

A passivation layer 180 is disposed on the source electrode 191, the drain electrode 192, and the pixel electrode 193. The passivation layer 180 is provided with a first contact hole 181 that partially exposes the first extension 191a of the source electrode 191.

A second extension 172 of a data line is disposed on the source electrode 191 exposed by the first contact hole 181. The source electrode 191 is connected to the data line through the first extension 191a and the second extension 172, the data line being disposed on the passivation layer 180.

Branch electrodes 271 forming a common electrode are disposed on the passivation layer 180. The branch electrodes 271 overlap the pixel electrode 193 and are defined by a plurality of cutouts 72. A first passivation member 272 is disposed on the data line 171.

The first passivation member 272 and the branch electrodes 271 may be formed on the same layer. The first passivation member 272 and the common electrode 270 may include the same material.

The second display panel 200 includes a second substrate 210.

The liquid crystal layer 3 includes liquid crystal molecules, and a long axis of each liquid crystal molecule may be parallel to the surfaces of the first and second substrates 110 and 210.

Figure 2:
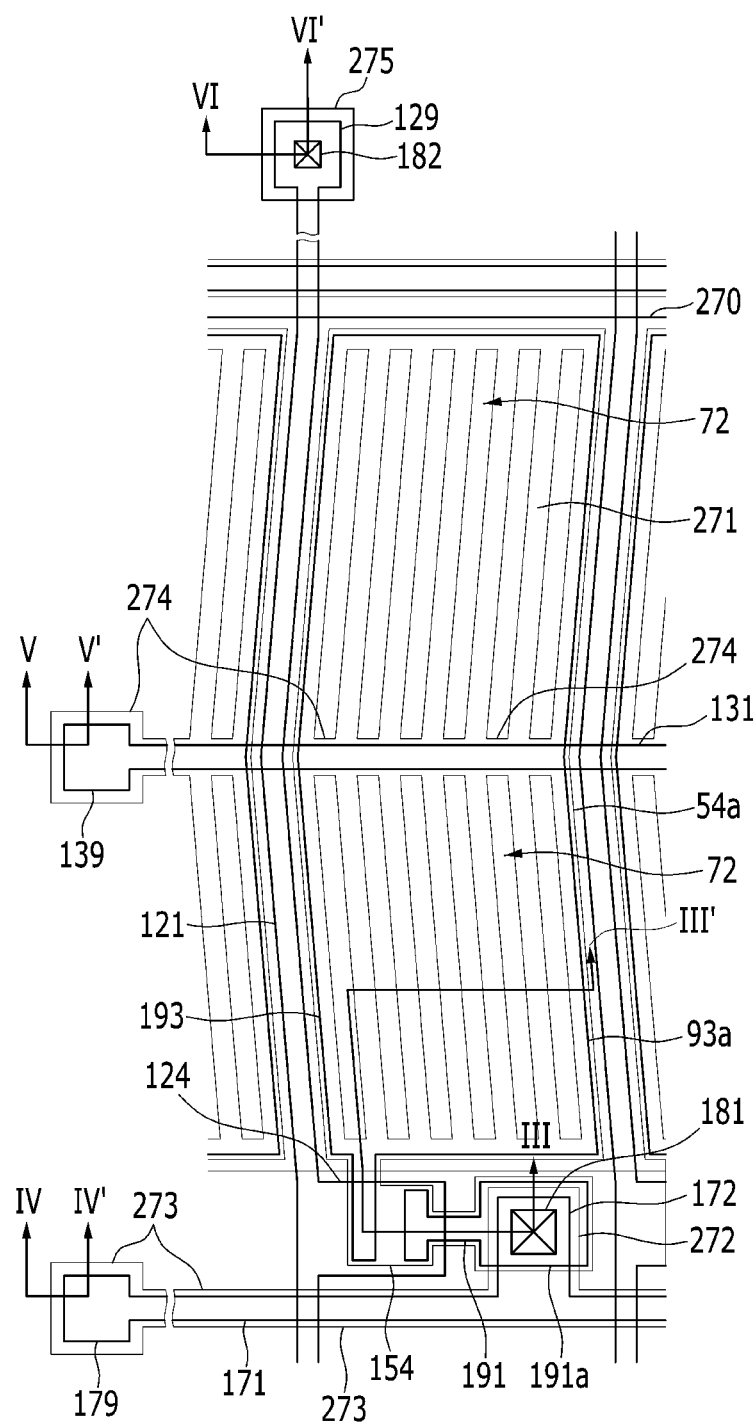
FIG. 2 is a layout view of one pixel of a liquid crystal display according to an exemplary embodiment.
Figure 3:
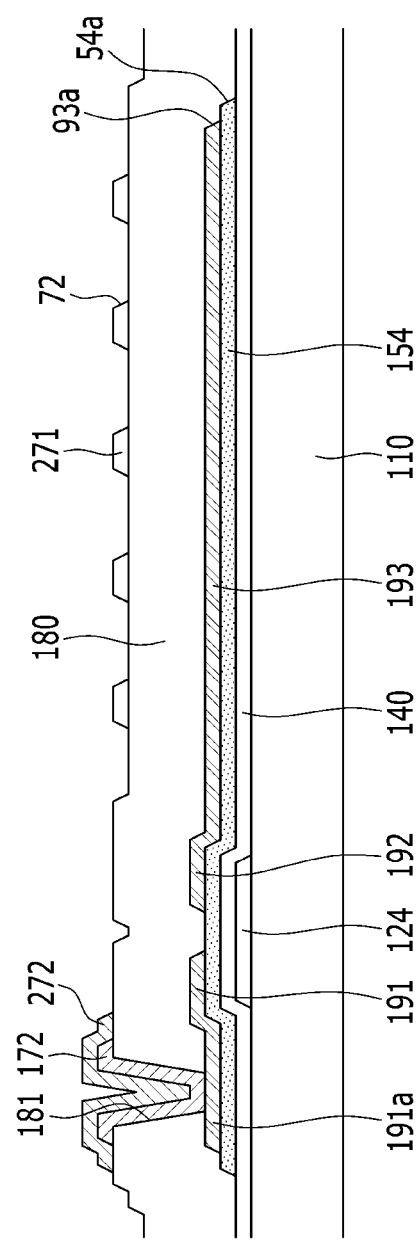
FIG. 3 is a cross-sectional view of a liquid crystal display of FIG. 2 taken along line III-III'.
Figure 4:
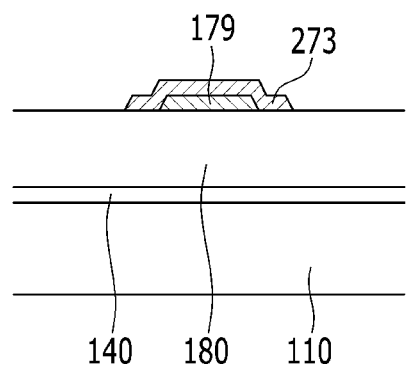
FIG. 4 is a cross-sectional view of a liquid crystal display of FIG. 2 taken along line IV-IV'.
Figure 5:
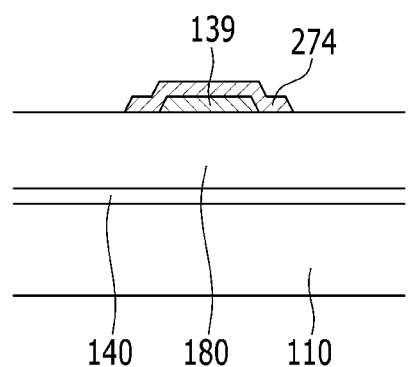
FIG. 5 is a cross-sectional view of a liquid crystal display of FIG. 2 taken along line V-V'.
Figure 6:
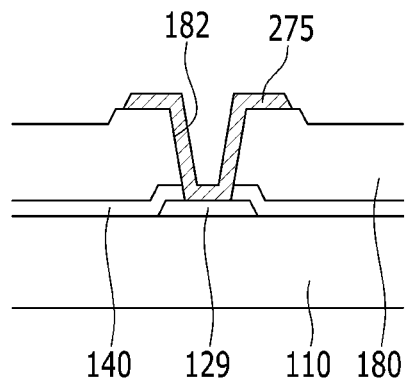
FIG. 6 is a cross-sectional view of a liquid crystal display of FIG. 2 taken along line VI-VI'.

FIG. 2 is a layout view of one pixel of a liquid crystal display according to one or more exemplary embodiments, FIG. 3 is a cross-sectional view of a liquid crystal display of FIG. 2 taken along line III-III', FIG. 4 is a cross-sectional view of a liquid crystal display of FIG. 2 taken along line IV-IV', FIG. 5 is a cross-sectional view of a liquid crystal display of FIG. 2 taken along line V-V', and FIG. 6 is a cross-sectional view of a liquid crystal display of FIG. 2 taken along line VI-VI'.

A first display panel 100 of the liquid crystal display according to an exemplary embodiment will be described with reference to FIG. 2 to FIG. 6.

A gate line 121 is disposed on a first substrate 110, and extends in a first direction. The gate line 121 includes a gate electrode 124 and a gate pad 129. A data line 171 extends in a second diction crossing the first direction. The data line 171 includes a second extension 172 and a data pad 179. The neighboring gate lines and the neighboring data lines may define a pixel including a pixel area visible to a user.

The gate line 121 may be made of an aluminum-based metal, such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), and titanium (Ti). The gate line 121 may have a multilayered structure including at least two conductive layers having different physical properties.

A gate insulating layer 140 made of a silicon nitride ($SiN_x$), a silicon oxide ($SiO_x$), or the like is formed on the gate line 121. The gate insulating layer 140 may have a multilayered structure including at least two insulating layers having different physical properties.

A semiconductor layer 154 is disposed on the gate insulating layer 140.

The semiconductor layer 154 includes an oxide semiconductor. The oxide semiconductor may include one of oxides based on titanium (Ti), hafnium (Hf), zirconium (Zr), aluminum (Al), tantalum (Ta), germanium (Ge), zinc (Zn), gallium (Ga), tin (Sn), or indium (In), and complex oxides thereof. For example, the oxide semiconductor may include at least one of zinc oxide (ZnO), indium-gallium-zinc oxide ($InGaZnO_4$), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O).

Transparent electrodes 191, 192, and 193 including a source electrode 191, a drain electrode 192, and a pixel electrode 193, are disposed directly on the semiconductor layer 154. The gate electrode 124, the source electrode 191, the drain electrode 192, and a portion of the semiconductor layer 154 between the source electrode 191 and the drain electrode 192 may configure a thin film transistor being placed outside of the pixel area. The portion of the semiconductor layer 154 between the source electrode 191 and the drain electrode 192 may function as a channel of the thin film transistor.

The source electrode 191, the drain electrode 192, and the pixel electrode 193 are placed at the same layer, and are made of a transparent conductive material.

The source electrode 191 faces the drain electrode 192, and includes a first extension 191a. The first extension 191a of the source electrode 191 protrudes toward a second extension 172 of a data line 171 and connects the source electrode 191 to the second extension 172. The source electrode 191 is connected to the data line 171 through the first extension 191a and the second extension 172.

The drain electrode 192 extends to form the pixel electrode 193. The pixel electrode 193, as an extending portion of the drain electrode 192, may extend to the pixel area of the pixel.

The source electrode 191, the drain electrode 192, and the pixel electrode 193 may include a transparent oxide metal layer that contains indium, zinc, and/or tin.

According to an exemplary embodiment, the planar shape of the semiconductor layer 154 except for the channel of the thin film transistor is substantially similar to that of the transparent electrodes 191, 192, and 193 in a top view. The same exposure mask may be used to form the semiconductor layer 154 and the transparent electrodes 191, 192, and 193 when manufacturing the liquid crystal display. Accordingly, manufacturing costs of the liquid crystal display may be reduced.

In one or more exemplary embodiments, a first edge 54a of the semiconductor layer 154 protrudes in the first direction and the second direction more than a second edge 93a of the transparent electrodes 191, 192, and 193, as shown in FIG. 3. The edge of the semiconductor layer 154 may surround the transparent electrodes 191, 192, and 193, as shown in FIG. 2. The semiconductor layer 154 and the pixel electrode 193 may have a step shape around the pixel area.

A passivation layer 180 is disposed on the source electrode 191, the drain electrode 192, and the pixel electrode 193. The passivation layer 180 may be made of an inorganic insulating material and the like. The channel of the thin film transistor disposed between the source electrode 191 and the drain electrode 192 is covered from the data line 171 by the passivation layer 180, thereby preventing the component of the metal layer forming the data line 171 from being diffused into the channel.

The passivation layer 180 is provided with a first contact hole 181 exposing the first extension 191a of the source electrode 191 and a second contact hole 182 exposing the gate pad 129.

The data line 171 and a common voltage line 131 are disposed on the passivation layer 180. The data line 171 includes the second extension 172 protruded toward the source electrode 191, and a data pad 179.

The common voltage line 131 includes a common pad 139.

The second extension 172 of the data line 171 is connected to the first extension 191a of the source electrode 191 through the first contact hole 181. The second extension 172 of the data line 171 contacts the first extension 191a of the source electrode 191 through the first contact hole 181. As such, the source electrode 191 and the data line 171 are directly connected to each other through the first contact hole 181. Accordingly, a signal transmitted through the data line 171 is effectively transmitted to the source electrode 191 without delay, and the signal of the data line 171 may be effectively transmitted to the pixel electrode 193 through the source electrode 191 and the drain electrode 192 even though the source electrode 191 and the drain electrode 192 is formed of the transparent oxide metal.

The data line 171 and the common voltage line 131 may be placed at the same layer. The data line 171 and the common voltage line 131 may be made of a refractory metal such as molybdenum, chromium, tantalum, and titanium, or an alloy thereof. The data line 171 and the common voltage line 131 may have a multilayered structure including a refractory metal layer and a low resistive conductive layer. For instance, the multilayered structure may include a double layer including a chromium or molybdenum (alloy) lower layer and an aluminum (alloy) upper layer, and a triple layer including a molybdenum (alloy) lower layer, an aluminum (alloy) intermediate layer, and a molybdenum (alloy) upper layer. However, aspects of the data line 171 and the common voltage line 131 are not limited there to. The data line 171 may be made of various other metals and conductors.

The common electrode 270 is disposed on the passivation layer 180. The common electrode 270 overlaps the pixel electrode 193, and includes the plurality of branch electrodes 271 defined by the plurality of cutouts 72.

The first passivation member 272 is disposed on the second extension 172 of the data line 171 directly connected to the source electrode 191, and a second passivation member 273 is disposed on the data line 171 and the data pad 179. The first and second passivation members 272 and 273 may cover upper and lateral surfaces of the second extension 172, the data line 171 and the data pad 179.

The branch electrodes 271 are connected to a third passivation member 274 covering upper and lateral surfaces of the common voltage line 131 and the common pad 139. The third passivation member 274 may extend from the branch electrodes 271 to cover the common voltage line 131. That is, the common electrode 270 may include the branch electrodes 271 and the third passivation member 274 and be directly contacted with the common voltage line 131.

The first passivation member 272, the second passivation member 273, and the third passivation member 274 are placed at the same layer as the branch electrodes 271, and cover the data line 171 and the common voltage line 131 formed as the metal layer. Thus, diffusion of the component of the metal layer into the liquid crystal layer may be prevented.

The branch electrodes 271 may receive a common voltage through the third passivation member 274 covering the common voltage line 131. Therefore, a signal of the common voltage line 131 may be effectively transferred to the branch electrodes 271.

The second passivation member 273 and the third passivation member 274 facilitate the connection between the data pad 179 and common pad 139 and an external driver.

A fourth passivation member 275 is disposed on the gate pad 129 exposed by the second contact hole 182 of the passivation layer 180. The fourth passivation member 275 is placed at the same layer as the common electrode 270, and facilitates the connection between the gate pad 129 and an external gate signal transmitting driver.

A portion of the liquid crystal display according to an exemplary embodiment will be described with reference to FIG. 7 and FIG. 8.

Figure 7:
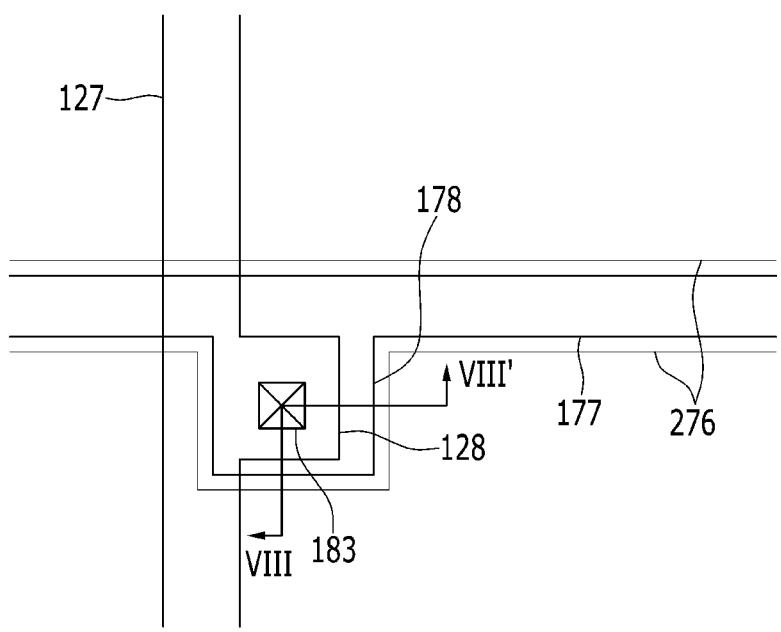
FIG. 7 is a layout view of signal lines of a liquid crystal display according to an exemplary embodiment.
Figure 8:
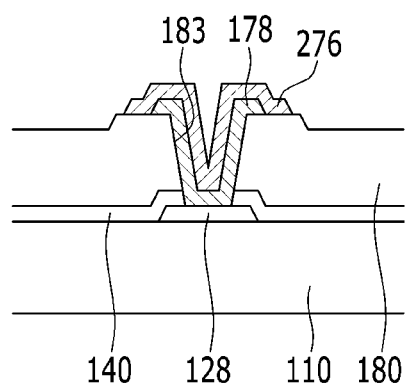
FIG. 8 is a cross-sectional view of a liquid crystal display of FIG. 7 taken along line VIII-VIII'.
Figure 9:
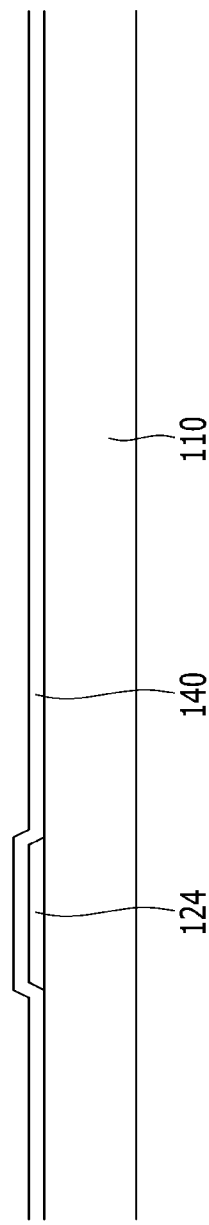
FIG. 9 to FIG. 48 are cross-sectional views sequentially illustrating processes of a method of manufacturing a liquid crystal display according to an exemplary embodiment.
Figure 10:
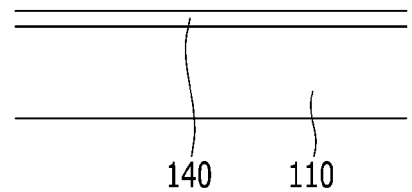
Figure 11:
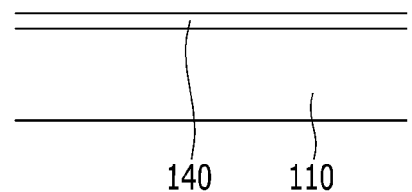
Figure 12:
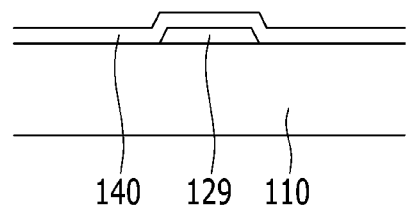
Figure 13:
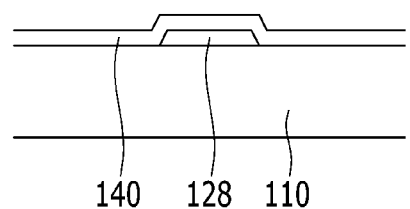
Figure 14:
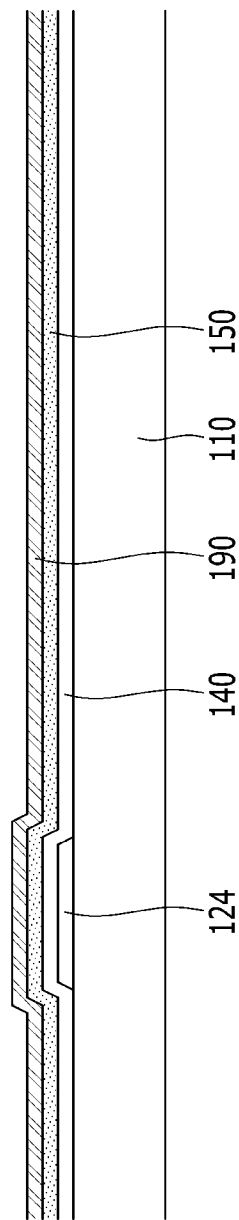
Figure 15:
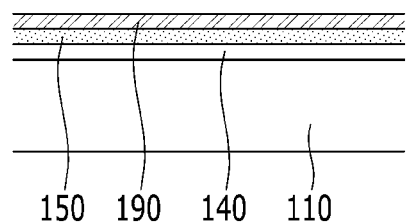
Figure 16:
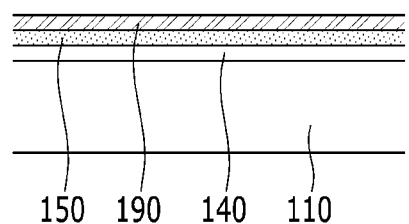
Figure 17:
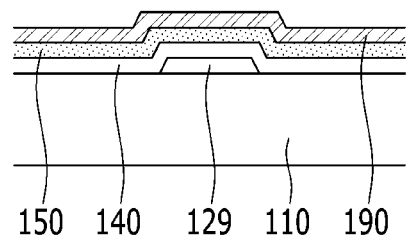
Figure 18:
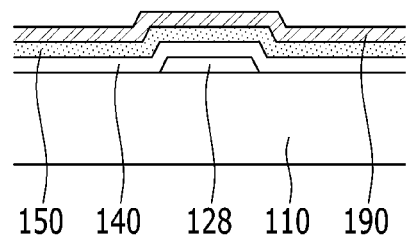
Figure 19:
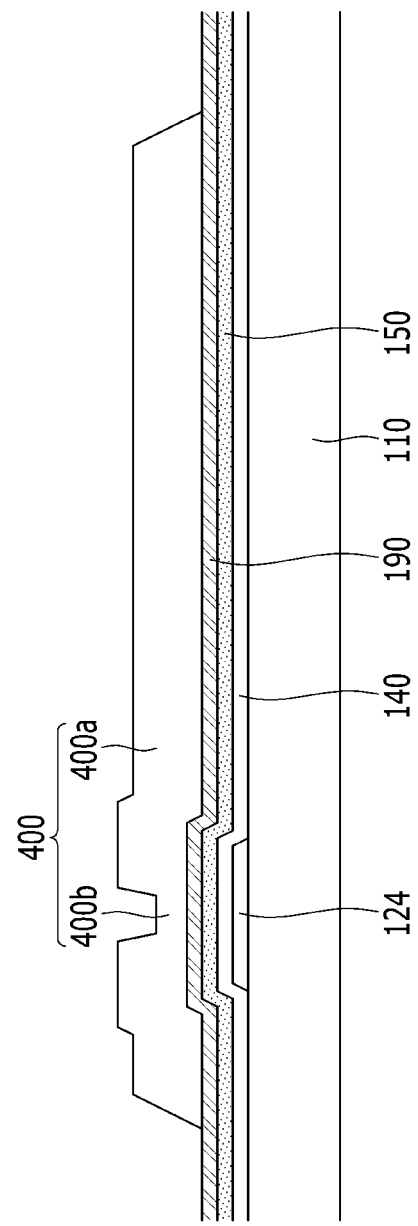
Figure 20:
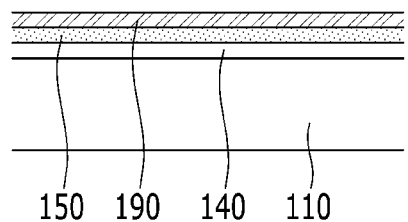
Figure 21:
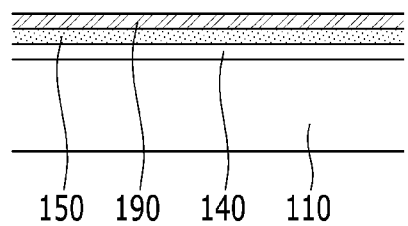
Figure 22:
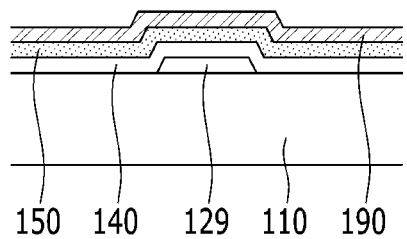
Figure 23:
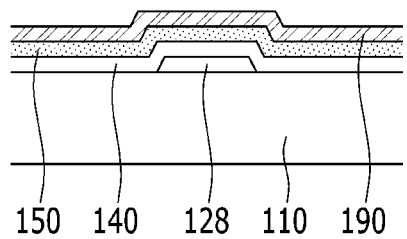
Figure 24:
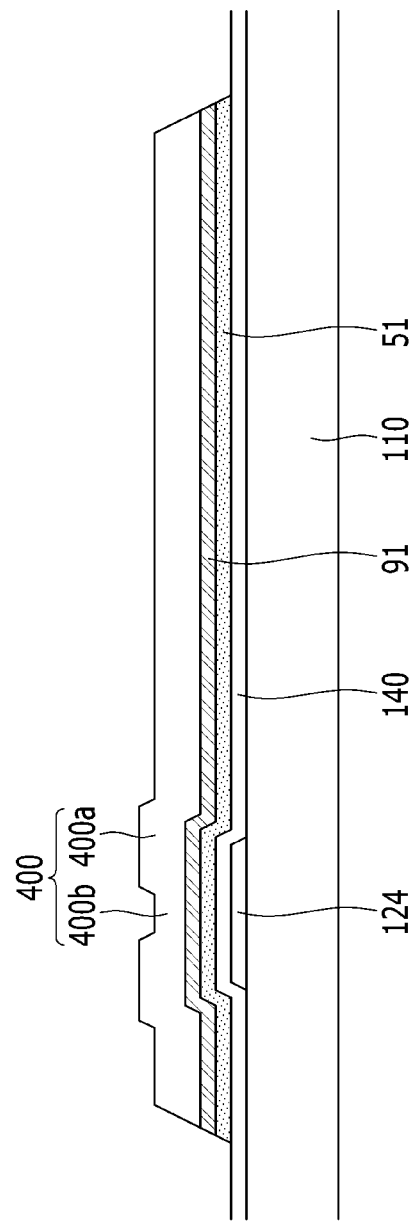
Figure 25:
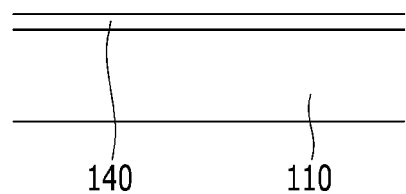
Figure 26:
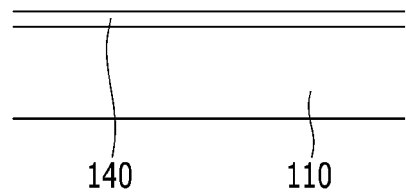
Figure 27:
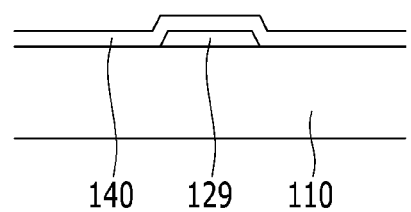
Figure 28:
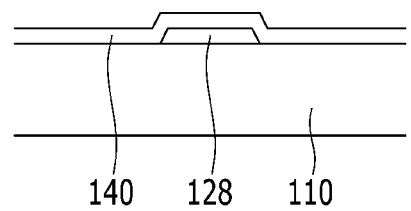
Figure 29:
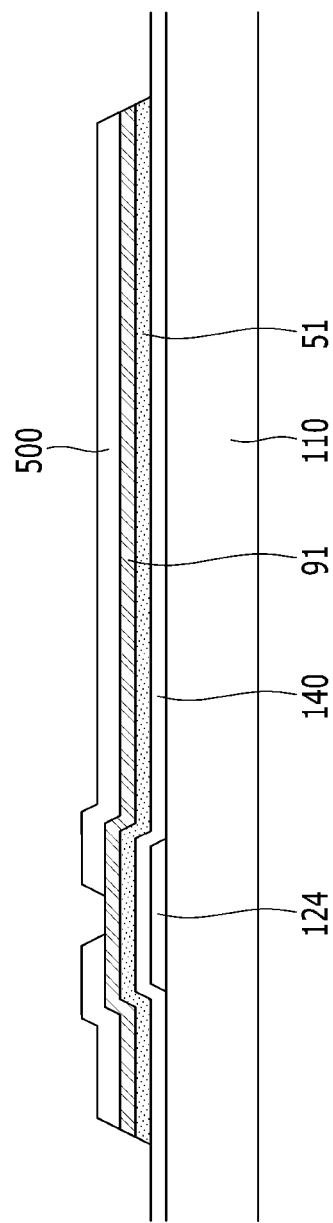
Figure 30:
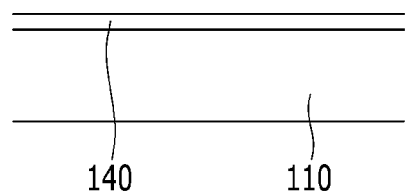
Figure 31:
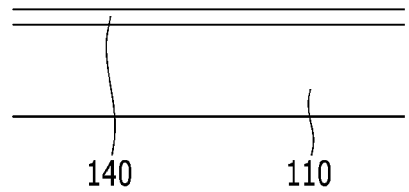
Figure 32:
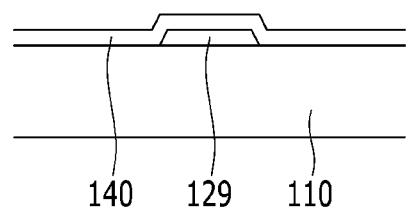
Figure 33:
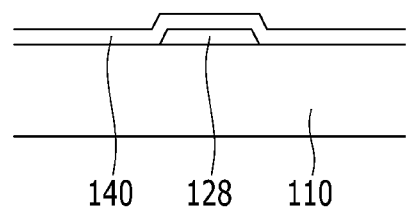
Figure 34:
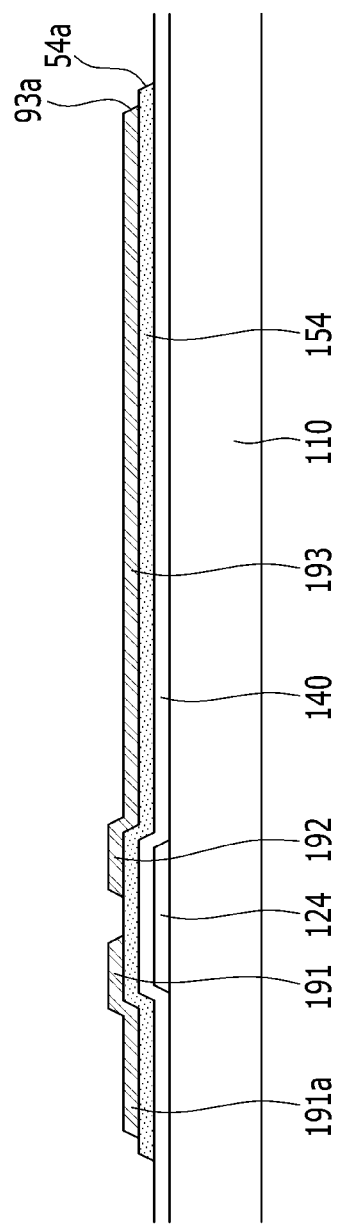
Figure 35:
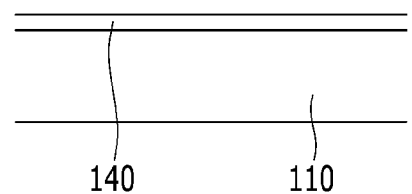
Figure 36:
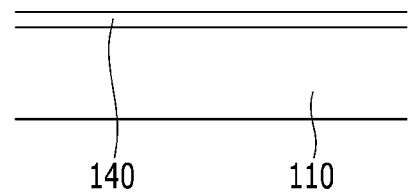
Figure 37:
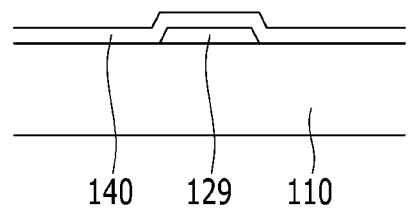
Figure 38:
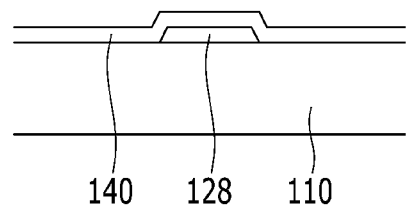
Figure 39:
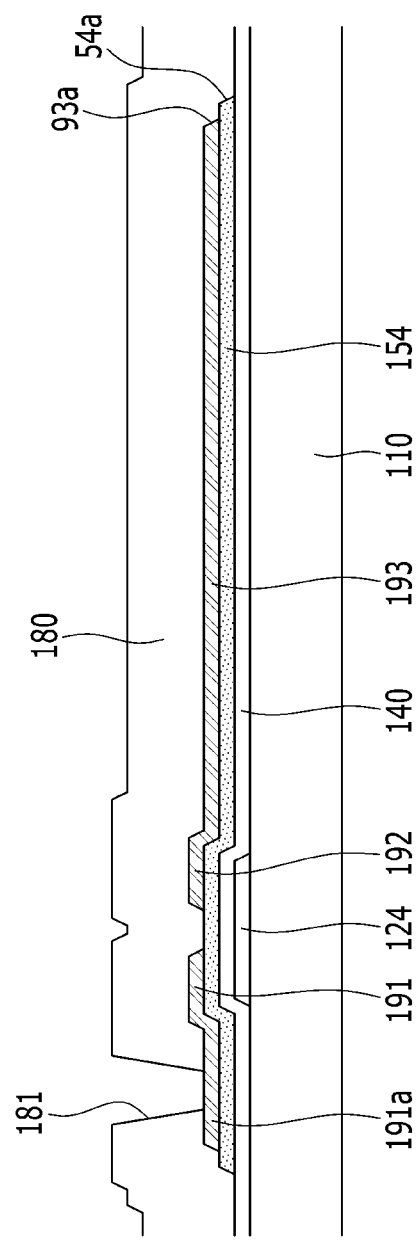
Figure 40:
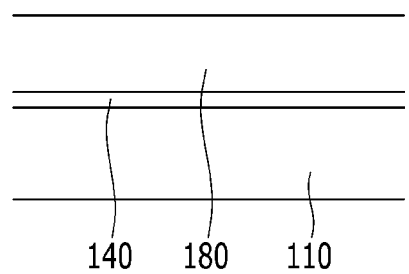
Figure 41:
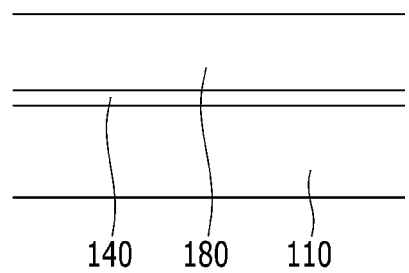
Figure 42:
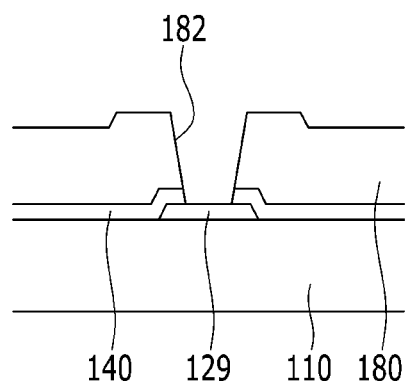
Figure 43:
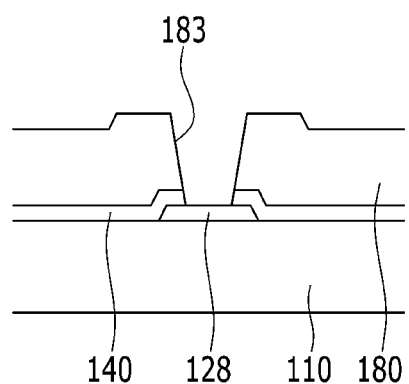
Figure 44:
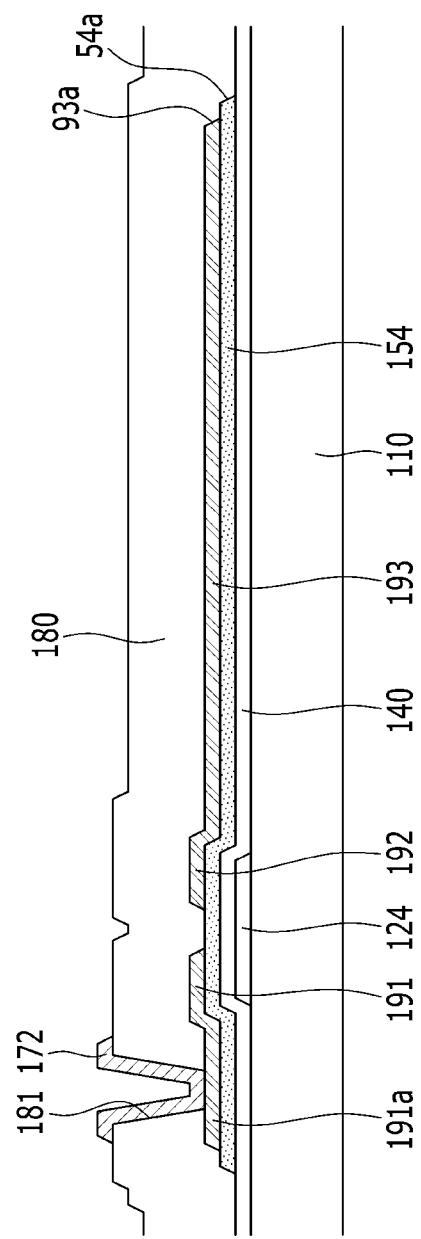
Figure 45:
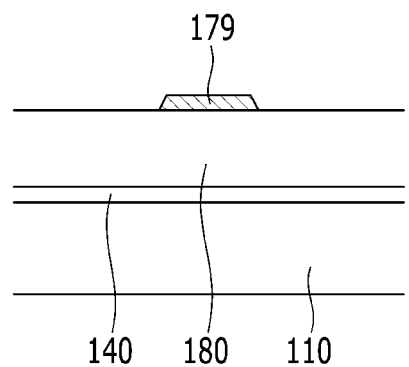
Figure 46:
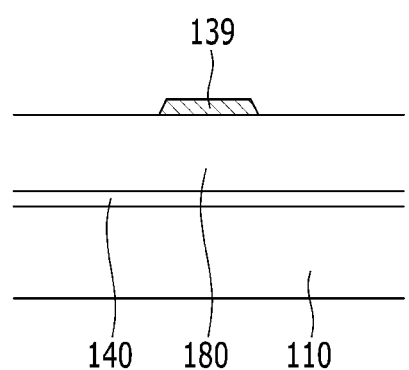
Figure 47:
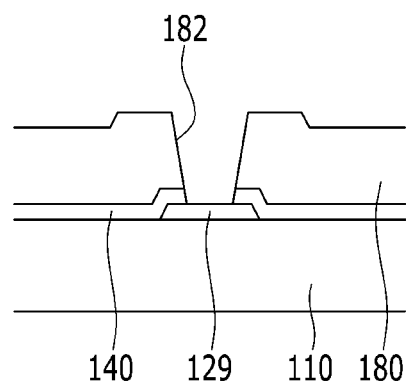
Figure 48:
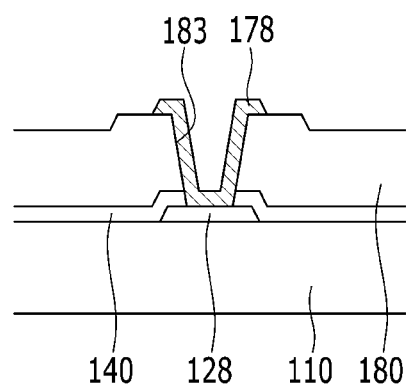

FIG. 7 is a layout view of signal lines of a liquid crystal display according to an exemplary embodiment, and FIG. 8 is a cross-sectional view of a liquid crystal display of FIG. 7 taken along line VIII-VIII'.

Referring to FIGS. 7 and 8, the liquid crystal display includes a first layer 127 extending in a first direction and a second layer 177 extending in a second direction crossing the first direction. The first layer 127 includes a third extension 128 protruding in the second direction, and the second layer 177 includes a fourth extension 178 protruding in the first direction.

The first layer 127 together with the third extension 128 may be disposed on a first substrate 110, and a gate insulating layer 140 may cover the first layer 127. The second layer 177 is disposed on a passivation layer 180 that is on the gate insulating layer 140. In one or more exemplary embodiments, the first layer 127 may be placed at the same layer as the gate line 121, and the second layer 177 may be placed at the same layer as the data line 171.

The third extension 128 of the first layer 127 and the fourth extension 178 of the second layer 177 are directly connected to each other by a third contact hole 183 formed in the gate insulating layer 140 and the passivation layer 180.

A fifth passivation member 276 formed on the same layer as the common electrode 270 is disposed on the second layer 177. The fifth passivation member 276 may cover upper and lateral surfaces of the second layer 177.

Since the first layer 127 placed at the same layer as the gate line 121 and the second layer 177 placed at the same layer as the data line 171 are directly connected to each other through the third contact hole 183, a signal of the first layer 127 may be effectively transmitted to the second layer 177 or a signal of the second layer 177 may be effectively transmitted to the first layer 127. In addition, since the fifth passivation member 276 covers upper and lateral surfaces of the second layer 177, it is possible to prevent diffusion of the component of the metal layer into the liquid crystal layer.

The portion illustrated in FIG. 7 and FIG. 8 may be a portion of a periphery area disposed at a periphery of a display area of the liquid crystal display.

According to one or more exemplary embodiments, the source electrode, the drain electrode, and the pixel electrode as a transparent metal layer are disposed directly on the semiconductor layer, the passivation layer is disposed on the semiconductor layer between the source electrode and the drain electrode, and the data line is formed on the passivation layer. Thus, it is possible to prevent a metal material generated in a process of forming the data line from flowing and diffusing in the semiconductor layer. Therefore, the thin film transistor including the semiconductor layer may have improved reliability.

According to an exemplary embodiment, because the data line and the common voltage line disposed on the passivation layer are covered by the passivation members formed on the same layer as the common electrode, it is possible to prevent the metal component of the signal line from flowing and diffusing in the liquid crystal layer.

Further, According to an exemplary embodiment, the passivation member covering the common voltage line may transmit a signal of the common voltage line to the common electrode. Therefore, the signal of the common voltage line may be effectively transmitted to the common electrode.

Now, a method of manufacturing a liquid crystal display according to one or more exemplary embodiments will be described with reference to FIG. 9 to FIG. 48 together with FIG. 1 to FIG. 8.

FIG. 9 to FIG. 48 are cross-sectional views sequentially illustrating processes of a method of manufacturing a liquid crystal display according to one or more exemplary embodiments.

FIG. 9, FIG. 14, FIG. 19, FIG. 24, FIG. 29, FIG. 34, FIG. 39, and FIG. 44 illustrate cross-sectional views of FIG. 2 taken along line III-III'. FIG. 10, FIG. 15, FIG. 20, FIG. 25, FIG. 30, FIG. 35, FIG. 40, and FIG. 45 illustrate cross-sectional views of FIG. 2 taken along line IV-IV'. FIG. 11, FIG. 16, FIG. 21, FIG. 26, FIG. 31, FIG. 36, FIG. 41, and FIG. 46 illustrate cross-sectional views of FIG. 2 taken along line V-V. FIG. 12, FIG. 17, FIG. 22, FIG. 27, FIG. 32, FIG. 37, FIG. 42, and FIG. 47 illustrate cross-sectional views of FIG. 2 taken along line VI-VI'. FIG. 13, FIG. 18, FIG. 23, FIG. 28, FIG. 33, FIG. 38, FIG. 43, and FIG. 48 illustrate cross-sectional views of FIG. 7 taken along line VIII-VIII'.

Referring to FIG. 9 to FIG. 13, a gate line 121 including a gate electrode 124 and a gate pad 129 and a first layer 127 formed on the same layer as the gate line 121 and including a third extension 128 are formed on a first substrate 110, and a gate insulating layer 140 is formed on the gate line 121 and the first layer 127.

Referring to FIG. 14 to FIG. 18, a first oxide semiconductor layer 150 and a first transparent metal layer 190 are sequentially stacked on the gate insulating layer 140. In one or more exemplary embodiments, the first transparent metal layer 190 may be a transparent oxide conductive layer.

A first photosensitive film pattern 400 is formed on the first transparent metal layer 190 using an exposure mark. A photosensitive film is formed on the first transparent metal layer 190, and then exposed and developed such that a first photosensitive film pattern 400 having a first thickness 400a and a second thickness 400b different from each other depending on its position is formed, as shown in FIG. 19 to FIG. 23.

There are several methods of forming the thickness of the photosensitive film differently depending on the position thereof. For example, a semi-transparent area, as well as a transparent area and a light blocking area, may be disposed in an exposure mask. The semi-transparent area is provided with a slit pattern, a lattice pattern, or a thin film having intermediate transmittance or an intermediate thickness. When the slit pattern is used, a width of the slit or a gap between slits may be smaller than a resolution of a light exposure used in a photolithography process. In another example, a photosensitive film that is capable of reflowing may be used. That is, after forming a photosensitive film pattern in which reflow is possible with a typical mask having the transparent area and the light blocking area, the photosensitive film reflows to an area in which the photosensitive film does not remain, thereby forming a thin portion.

Referring to FIG. 24 to FIG. 28, a second oxide semiconductor layer 51 and a second transparent metal layer 91 are formed by etching the first oxide semiconductor layer 150 and the first transparent metal layer 190 by using the first photosensitive film pattern 400 as an etching mask. Further, a portion having the first thickness 400a of the first photosensitive film pattern 400 remains, and a portion having the second thickness 400b of the first photosensitive film pattern 400 is removed by reducing a height of the first photosensitive film pattern 400. Referring to FIG. 29 to FIG. 33, a second photosensitive film pattern 500 having the remaining portion corresponding to the first thickness 400a of the first photosensitive film pattern 400 is formed.

The second transparent metal layer 91 is etched by using the second photosensitive film pattern 500 as an etching mask, and the second photosensitive film pattern 500 is removed. Referring to FIG. 34 to FIG. 38, a source electrode 191, a drain electrode 192, and a pixel electrode 193 are formed from the second transparent metal layer 91, and a semiconductor layer 154 is formed from the second oxide semiconductor layer 51. The semiconductor layer 154 corresponding a channel may be exposed. The transparent metal layer corresponding to the source electrode 191, the drain electrode 192, and the pixel electrode 193 is etched twice, and the semiconductor layer 154 is etched once. In an exemplary embodiment, an edge of the transparent metal layer is etched to a greater degree than an edge of the semiconductor layer 154. The first edge 54a of the semiconductor layer 154 protrudes more than the second edge 93a of the source electrode 191, the drain electrode 192, and the pixel electrode 193. In an exemplary embodiment, the edge of the pixel electrode 193 and the edge of the semiconductor layer 154 may have a step shape around a pixel area of each pixel.

As shown in FIG. 39 to FIG. 43, after the semiconductor layer 154, the source electrode 191, the drain electrode 192, and the pixel electrode 193 are formed by performing a photolithography process once, a passivation layer 180 provided with a first contact hole 181, a second contact hole 182, and a third contact hole 183, is formed.

As shown in FIG. 44 to FIG. 48, a data line 171 including a second extension 172 directly connected to a first extension 191a of the source electrode 191 through the first contact hole 181 and a data pad 179 is formed, the common voltage line 131 including the common pad 139 is formed, and the second layer 177 formed on the same layer as the data line 171 and including the fourth extension 178 is formed. The data line 171, the common voltage line 131, and the second layer 177 are simultaneously formed on the same layer.

As shown in FIG. 1 to FIG. 8, a common electrode 270 overlapping the pixel electrode 193 and including branch electrodes 271, a first passivation member 272 on the second extension 172 of the data line 171 directly connected to the source electrode 191, a second passivation member 273 on the data line 171 and the data pad 179, a third passivation member 274 on a common voltage line 131 and a common pad 139, a fourth passivation member 275 on the gate pad 129 exposed by the second contact hole 182, and a fifth passivation member 276 on the second layer 177 including the fourth extension 178 are formed.

After the second substrate 210 is disposed to face the first substrate 110, the liquid crystal display is formed by injecting the liquid crystal layer 3 between the first substrate 110 and the second substrate 210.

According to exemplary embodiments, since the semiconductor layer and the transparent metal layer are formed by one photolithography process, it is possible to reduce manufacturing costs.

According to exemplary embodiments, since the semiconductor layer between the source electrode and the drain electrode is covered by the passivation layer, the flow and diffusion of the metal material in the semiconductor layer, which may occur in the following process, can be prevented. Therefore, a liquid crystal display may have a improved reliability.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A liquid crystal display comprising:
   a semiconductor layer disposed on a substrate;
   a transparent electrode disposed on the semiconductor layer, the transparent electrode overlapping the semiconductor layer and including a source electrode, a drain electrode facing the source electrode, and a first electrode extending from the drain electrode; and
   an insulating layer on the transparent electrode,
   wherein the semiconductor layer contacts an entire surface of the source electrode, the drain electrode, and the first electrode.

2. The liquid crystal display of claim 1, wherein the semiconductor layer comprises an oxide semiconductor.

3. The liquid crystal display of claim 1, wherein the substrate extends in a planar direction, and an edge of the semiconductor layer protrudes in the planar direction more than an edge of the transparent electrode.

4. The liquid crystal display of claim 1, wherein an edge of the semiconductor layer surrounds the transparent electrode.

5. The liquid crystal display of claim 1, further comprising:
   a data line disposed on the insulating layer,
   wherein the data line is directly connected to the source electrode through a contact hole provided in the insulating layer.

6. The liquid crystal display of claim 5, further comprising:
   a passivation member covering the data line; and
   a second electrode disposed on the insulating layer, the second electrode overlapping the first electrode.

7. The liquid crystal display of claim 6, wherein the passivation member and the second electrode comprise the same material.

8. The liquid crystal display of claim 6, further comprising a voltage line disposed on the insulating layer, the voltage line configured to transfer a voltage to the second electrode,
   wherein the voltage line and the second electrode directly contact each other.

9. The liquid crystal display of claim 8, wherein:
   the data line and the voltage line comprise the same material; and
   the passivation member and the second electrode comprise the same material.

10. A method of manufacturing a liquid crystal display, comprising:
    forming a semiconductor layer and a transparent electrode on a substrate, the transparent electrode being disposed on the semiconductor layer and comprising a source electrode, a drain electrode facing the source electrode, and a first electrode extending from the drain electrode;
    forming an insulating layer on the semiconductor layer, the source electrode, the drain electrode, and the first electrode; and
    forming a signal line on the insulating layer,
    wherein the semiconductor layer and the transparent electrode are formed based on a same exposure mask.

11. The method of claim 10, wherein the forming of the semiconductor layer and the transparent electrode comprises:
    stacking an oxide semiconductor layer on the substrate;
    stacking a transparent oxide conductive layer on the oxide semiconductor layer;
    forming a photosensitive film on the transparent oxide conductive layer by using the exposure mask;
    first etching the transparent oxide conductive layer and the oxide semiconductor layer by using the photosensitive film as a mask; and
    second etching the transparent oxide conductive layer by using the photosensitive film as a mask,
    wherein the semiconductor layer and the transparent electrode are formed from the oxide semiconductor layer and the transparent oxide conductive layer, respectively.

12. The method of claim 11, further comprising:
    forming a passivation member on the signal line; and
    forming a second electrode on the insulating layer, the second electrode overlapping the first electrode,
    wherein the forming of the passivation member and the forming of the second electrode are simultaneously performed.

13. The method of claim 12, further comprising forming a voltage line on the insulating layer, the voltage line transferring a voltage to the second electrode,
    wherein the voltage line and the second electrode directly contact each other.

14. The method of claim 10, wherein an entire surface of the transparent electrode is contacted with the semiconductor layer.

15. The method of claim 10, wherein:
    the forming of the insulating layer comprises forming a contact hole exposing the source electrode; and
    the signal line is directly connected to the source electrode through the contact hole.

16. A liquid crystal display comprising:
    a semiconductor layer on a substrate;
    a source electrode, a drain electrode facing the source electrode, and a pixel electrode extending from the drain electrode, each of the source electrode, the drain electrode, and the pixel electrode disposed on the semiconductor layer;
    an insulating layer disposed on the semiconductor layer, the source electrode, the drain electrode, and the pixel electrode; and
    a signal line disposed on the insulating layer, the signal line being connected to the source electrode through a contact hole of the insulating layer,
    wherein the insulating layer separates a first portion of the semiconductor layer from the signal line, the first portion of the semiconductor layer being disposed between second and third portions of the semiconductor layer respectively overlapping the source electrode and the drain electrode.

17. The liquid crystal display of claim 16, wherein an entire surface of the source electrode, the drain electrode, and the pixel electrode contacts the semiconductor layer.

18. The liquid crystal display of claim 16, wherein:
- the pixel electrode extends to a pixel area from the drain electrode;
- the source electrode, the drain electrode, and the first to third portions of the semiconductor layer are included in a thin film transistor placed outside of the pixel area; and
- a fourth portion of the semiconductor layer disposed in the pixel area and the pixel electrode have a step shape around the pixel area.

19. The liquid crystal display of claim 16, wherein the source electrode, the drain electrode, and the pixel electrode are formed of a same material.

20. The liquid crystal display of claim 16, further comprising:
- a common electrode disposed on the insulating layer;
- a liquid crystal layer disposed on the insulating layer; and
- a passivation member separating the signal line from the liquid crystal layer,
- wherein the common electrode and the passivation member include the same material.

* * * * *